(12) United States Patent
Zhang et al.

(10) Patent No.: US 11,365,089 B2
(45) Date of Patent: Jun. 21, 2022

(54) ELEVATOR OPERATION QUALITY TESTER

(71) Applicants: FUJIAN SPECIAL EQUIPMENT INSPECTION AND RESEARCH INSTITUTE, Fuzhou (CN); FUZHOU XINAOTENA TECHNOLOGY CO., LTD, Fuzhou (CN); FUZHOU ECLOUDIA INFORMATION TECHNOLOGY CO., LTD, Fuzhou (CN)

(72) Inventors: Wei Zhang, Fujian (CN); Qinda Zeng, Fujian (CN); Zhongnan Xu, Fujian (CN); Zuen He, Fujian (CN); Jianpeng Deng, Fujian (CN); Siwen Huang, Fujian (CN); Dongfang Ding, Fujian (CN); Caiyu Bao, Fujian (CN)

(73) Assignees: FUJIAN SPECIAL EQUIPMENT INSPECTION AND RESEARCH INSTITUTE, Fuzhou (CN); FUZHOU XINAOTENA TECHNOLOGY CO., LTD, Fuzhou (CN); FUZHOU ECLOUDIA INFORMATION TECHNOLOGY CO., LTD, Fuzhou (CN)

(*) Notice: Subject to any disclaimer, the term of this patent is extended or adjusted under 35 U.S.C. 154(b) by 412 days.

(21) Appl. No.: 16/428,967

(22) Filed: Jun. 1, 2019

(65) Prior Publication Data
US 2020/0223662 A1    Jul. 16, 2020

(30) Foreign Application Priority Data
Jan. 11, 2019 (CN) .......................... 201910028086.1

(51) Int. Cl.
*B66B 5/00* (2006.01)
*B66B 5/06* (2006.01)
(Continued)

(52) U.S. Cl.
CPC .......... *B66B 5/0031* (2013.01); *B66B 5/0037* (2013.01); *B66B 5/06* (2013.01);
(Continued)

(58) Field of Classification Search
CPC ... B66B 5/0037; B66B 5/0006; B66B 5/0018; B66B 5/0031; B66B 5/0043; B66B 5/06; G01P 15/18; G01H 1/00; G01H 11/06
See application file for complete search history.

(56) References Cited

U.S. PATENT DOCUMENTS 4,880,082 A * 11/1989 Kahkipuro ............ B66B 1/3492
187/394
5,522,480 A * 6/1996 Hofmann .............. B66B 1/3492
187/288

(Continued)

*Primary Examiner* — Helen C Kwok

(57) ABSTRACT

The invention provides an elevator operation quality tester, comprising a rectangle aluminium-alloy housing provided with a casing and a covering, an upper opening of the casing is provided with a groove for embedding in a touching screen; circuit board, three-axis acceleration sensor and rechargeable battery supplying power to the circuit board are provided in the casing; the circuit board is provide with elevator vibration data acquisition circuit, back-end data processing system, interface circuit and radio communication circuit; the casing is provided with a handle on the side; the elevator vibration data acquisition circuit comprises a power isolation module, a power circuit conversion module, a three-axis acceleration sensor, an analog and digital signal isolation module and a analog-digital conversion module, the power isolation module isolates an external power supply, and the power isolation module is connected to the power circuit conversion module.

9 Claims, 10 Drawing Sheets

(51) Int. Cl.
*G01H 11/06* (2006.01)
*G01P 15/18* (2013.01)
*G01H 1/00* (2006.01)
*H05K 5/04* (2006.01)

(52) U.S. Cl.
CPC .............. *G01H 1/00* (2013.01); *G01H 11/06* (2013.01); *G01P 15/18* (2013.01); *H05K 5/04* (2013.01)

(56) References Cited

U.S. PATENT DOCUMENTS

| | | | |
|---|---|---|---|
| 2003/0070483 A1* | 4/2003 | Mueller ............. | G01C 19/5783 73/493 |
| 2005/0077117 A1* | 4/2005 | Shrum ................. | B66B 5/0037 187/393 |
| 2009/0255335 A1* | 10/2009 | Fly ....................... | G01P 15/125 73/493 |
| 2011/0196515 A1* | 8/2011 | Niki ........................ | G01D 7/00 700/83 |
| 2017/0029244 A1* | 2/2017 | Madarasz ............. | B66B 5/0037 |
| 2020/0130998 A1* | 4/2020 | Schmidt ................ | B66B 1/3453 |
| 2020/0148504 A1* | 5/2020 | Pahlke .................. | B66B 5/0018 |
| 2020/0172373 A1* | 6/2020 | Pahlke ................... | B66B 13/02 |
| 2020/0317471 A1* | 10/2020 | Kim ....................... | G01D 21/02 |
| 2020/0361745 A1* | 11/2020 | Pahlke .................. | B66B 1/3461 |
| 2021/0155454 A1* | 5/2021 | Kinnari ................ | B66B 5/0031 |

\* cited by examiner

ELEVATOR OPERATION QUALITY TESTER

BACKGROUND OF THE INVENTION

1. Field of the Invention

The invention relates to the technical field of special equipment, in particular to an elevator operation quality tester.

2. Background Art

By the end of 2017, China had installed 5.627 million elevators, accounting for one-third of the global total. According to statistics, the number of elevator help call received by the police through the whole nation is more than 1000 per day, accounting for about 80% of the total number of complaints about special equipment, and the casualties caused by elevator failures exceeds 100 per year, a large number of malfunctions and hidden dangers are still not effectively controlled, thereby elevator safety has become a matter of concern for people's livelihood. The prior security forewarning analysis of elevator is realized by the detection of elevator carriage quality; for example, EVA in the United States, which is a common tool for elevator vibration testing, has not been improved and upgraded for 20 years, and has limitations as follows: the EVA is large, cumbersome and inconvenient to carry, the interface thereof is only in English; the acceleration accuracy is ±0.6 mg, the displacement accuracy is 2%, noise accuracy 0.1 db; the filtering and spectral analysis cannot be realized by the tester, the measurement results and data analysis rely on the PC, the tester itself cannot display and print test results on site, the test results do not have intelligent judgment, and the number of points and positions exceeding standard cannot be counted and marked; remote online monitoring and malfunction forewarning based on big data cannot be realized; the prior elevator vibration data is collected and sent to the CPU in the back-end data processing system for subsequent processing, but the digital circuits in the back-end data processing system have much noise; when the elevator vibration data acquisition circuit is directly connected to the back-end data processing system, the noise of the digital circuits in the back-end data processing system is transmitted to the data acquisition circuit through conduction, thereby causing a low accuracy of the data collected by the elevator vibration data acquisition circuit. In addition, the prior three-axis acceleration sensor is difficult to fix sensors in three directions, and the differential signal acquired by the three-axis acceleration sensors from three directions have low sensitivity.

SUMMARY OF THE INVENTION

In order to overcome above problems, the object of the invention is to provide an elevator operation quality tester, which is portable, the invention can realize data acquisition from three directions, improves signal-noise ratio of the elevator vibration data acquisition circuit, and also has the function of reducing noise.

The invention is realized by the following technical scheme: an elevator operation quality tester, comprising a rectangle aluminium-alloy housing, the rectangle aluminium-alloy housing comprises a casing and a covering, an upper opening of the casing is provided with a groove for embedding in a touching screen; a circuit board, a three-axis acceleration sensor and a rechargeable battery supplying power to the circuit board are provided in the casing; the circuit board is provide with elevator vibration data acquisition circuit, back-end data processing system, interface circuit and radio communication circuit; the casing is provided with a handle on the side; the elevator vibration data acquisition circuit is connected to the back-end data processing system, the elevator vibration data acquisition circuit comprises a power isolation module, a power circuit conversion module, a three-axis acceleration sensor, an analog and digital signal isolation module and a analog-digital conversion module, the power isolation module isolates an external power supply, and the power isolation module is connected to the power circuit conversion module, the power circuit conversion module converts the 12V power into a power supply voltage required by the three-axis acceleration sensor and a power supply voltage required by the analog-digital conversion module, the three-axis acceleration sensor converts the acquired analog signal data into digital signal data through the analog-digital conversion module, the analog and digital signal isolation module is connected to the analog-digital conversion module and the back-end data processing system respectively, and the analog and digital signal isolation module is configured to prevent noise of the back-end data processing system from being transmitted to the elevator vibration data acquisition circuit through conduction, thereby reducing noise interference to the elevator vibration data acquisition circuit; the three-axis acceleration sensor comprises a baseplate and a shell covered on the baseplate, a first circuit board is fixedly arranged in the x-axis direction of the baseplate, a second circuit board is fixedly arranged in the y-axis direction of the baseplate, and a third circuit board is fixedly arranged in the z-axis direction of the baseplate, the first circuit board, the second circuit board and the third circuit board are formed a structure of being perpendicular each other, the first circuit board, the second circuit board and the third circuit board are all provided with an acceleration sensor module and a conditioning circuit for adjusting the data accuracy of the sensor, the conditioning circuit is connected to the acceleration sensor module, the acceleration sensor module on the first circuit board, the acceleration sensor module on the second circuit board, and the acceleration sensor module on the third circuit board are formed an acceleration signal for measuring three directions of the x-axis, the y-axis, and the z-axis.

Further, the casing is provided with a drawer on the side, two grooves are provided on the drawer, a vibration identification device is provided in each groove, the vibration identification device comprises a tubbiness shell, a receiving groove is provided on the tubbiness shell, a rotary column is provided in the receiving groove, an elastic stretching fixing rope is symmetrically arranged on the rotary column, a hook for hooking handrail belt of escalator is provided on the end of the elastic stretching fixing rope; a rotary handle is provided on the rotary column; the tubbiness shell is provided with a rechargeable battery and a circuit board powered by the rechargeable battery; the circuit board is provided with a MCU, the MCU is connected to a vibrating sensor and a bluetooth communication module; the circuit board is further provided with a charging and discharging circuit, a power supply end of the charging and discharging circuit is connected to the positive and negative electrodes on the sidewall of the tubbiness shell; a switch button is provided on the tubbiness shell; and the tubbiness shell is provided with a limiting convex portion corresponding to a limiting concave portion on the sidewall of the groove; positive and negative electrode columns are provided in the grooves, the positive and negative electrode columns are respectively correspond to positive and negative electrodes; a clamping part is arranged on the sidewall of the drawer for the drawing and clamping of the drawer.

Further, the power isolation module comprises a power module URB2412YMD-10WR3, a capacitor C87, a capacitor C88, an electrolytic capacitor CD17, a capacitor C86, a capacitor C85, and an electrolytic capacitor CD16, the capacitor C87, capacitor C88 and the electrolytic capacitor CD17 are connected in parallel, one end of the electrolytic capacitor CD17 is connected to an internal power supply, the other of the electrolytic capacitor CD17 is connected to analog signal ground GND, one end of the capacitor C87 is connected to VOUT pin of the power module URB2412YMD-10WR3, the other of the capacitor C87 is connected to VGND pin of the power module URB2412YMD-10WR3, the capacitor C86, the capacitor C85 and the electrolytic capacitor CD16 are connected in parallel, one end of the electrolytic capacitor CD16 is connected to an outer power supply, the other of the electrolytic capacitor CD16 is connected to digital signal ground DGND, one end of the capacitor C85 is connected to VIN pin of the power module URB2412YMD-10WR3, the other end of the capacitor C85 is connected to EARTH pin of the power module URB2412YMD-10WR3.

Further, the power circuit conversion module comprises 12V power to 9V power circuit, 9V power to 3.3V power circuit, 9V power to 2.5V power circuit and 9V power to 5V power circuit, the 12V power to 9V power circuit is connected to the power isolation module, one end of the 9V power to 3.3V power circuit, the 9V power to 2.5V power circuit and the 9V power to 5V power circuit are all connected to the 12V power to 9V power circuit, the other end of the 9V power to 3.3V power circuit, the 9V power to 2.5V power circuit and the 9V power to 5V power circuit are all connected to the analog-digital conversion module, and the three-axis acceleration sensor is connected to the 9V power to 3.3V power circuit.

Further, the 12V power to 9V power circuit comprises LM317DCY chip, a capacitor C8, a chip inductor B2, an electrolytic capacitor CD3, a capacitor C9, a resistor R14, a capacitor C12, a resistor R11, a diode D3, a resistor R9, an electrolytic capacitor CD2, a capacitor C6, a capacitor C7, and a resistor R953; the electrolytic capacitor CD3 and the capacitor C9 are connected in parallel, and one end of the circuit thereafter is connected to the capacitor C8 and the chip inductor B2 in series, the other end is connected to VIN pin of the LM317DCY chip; the capacitor C8 is connected to an internal power supply of the power isolation module, the resistor R14 and the capacitor C12 are connected in parallel, and one end of the circuit thereafter is connected to ADJ pin of the LM317DCY chip, the other end is connected to analog signal ground GND; the resistor R11 and the diode D3 are connected in parallel, and one end of the circuit thereafter is connected to OUT pin of the LM317DCY chip, the other end is connected to the capacitor C12; the electrolytic capacitor CD2, the capacitor C6, the capacitor C7 and the resistor R953 are connected in parallel, and one end of the circuit thereafter is connected to one end of the resistor R9, the other end is connected to analog signal ground GND; the other end of the resistor R9 is connected to the diode D3;

the 9V power to 3.3V power circuit comprises AZ1117H-3.3TRG1 chip, a capacitor C17, a capacitor C18, a capacitor C19, a capacitor C20 and a resistor R15, the capacitor C17 and the capacitor C18 are connected in parallel, and one end of the circuit thereafter is connected to the capacitor C7 of the 12V power to 9V power circuit, the other end is connected to IN pin of the AZ1117H-3.3TRG1 chip, VOUT pin of the AZ1117H-3.3TRG1 chip is connected to OUT pin in parallel, the capacitor C19, the capacitor C20 and the resistor R51 are connected in parallel, and one end of the circuit thereafter is connected to VOUT pin of the AZ1117H-3.3TRG1 chip, the other end is connected to the analog signal ground GND;

the 9V power to 2.5V power circuit comprises AZ1117EHADJ chip, a capacitor C26, a capacitor C27, a resistor R19, a resistor R20, a capacitor C22, a capacitor C23 and a resistor R50, the capacitor C26 and the capacitor C27 are connected in parallel, and one end of the circuit thereafter is connected to the capacitor C7 of the 12V power to 9V power circuit, the other end is connected to VIN pin of the AZ1117EHADJ chip; the resistor 19 and the resistor R20 are connected in series, one end of the resistor R20 is connected to ADJ pin of the AZ1117EHADJ chip, the other end thereof is connected to OUT pin of the AZ1117EHADJ chip; the capacitor C22, the capacitor C23 and the resistor R50 are connected in parallel, and one end of the circuit thereafter is connected to OUT pin of the AZ1117EHADJ chip, the other end is connected to the analog signal ground GND;

the 9V power to 2.5V power circuit comprises ADR4533ARZ chip, a capacitor C50, a chip inductor B9, an electrolytic capacitor CD13, a capacitor C51, a resistor R34, an electrolytic capacitor CD14, a capacitor C52 and a capacitor C53, the electrolytic capacitor CD13 and the capacitor C51 are connected in parallel, and one end of the circuit thereafter is connected to the capacitor C50 and the chip inductor B9 in series, the other end is connected to Vin pin of the ADR4533ARZ chip; the electrolytic capacitor CD14, the capacitor C52 and the capacitor C53 are connected in parallel, and one end of the circuit thereafter is connected the resistor R34, the other end is connected to the analog signal ground GND, and the resistor R34 is connected to VOUT pin of the ADR4533ARZ chip.

Further, the acceleration sensor module comprises J39 socket and a sensor, the sensor is connected to the J39 socket, the sensor comprises E6308 chip, a capacitor C3, a capacitor C4, a capacitor C10, a resistor R6 and a resistor R7, the capacitor C4 is connected in series with the capacitor C10 and is connected in parallel with the capacitor C3 thereafter, the capacitor C3 is connected to the capacitor C20 of the AZ1117H-3.3TRG1 chip, a fifth pin of the J39 socket is connected to ST pin of the E6308 chip, one end of the capacitor C4 is connected to VDD pin of the E6308 chip, and the other end thereof is connected to VMID pin of the E6308 chip; the resistor R6 is connected to OUTN pin of the E6308 chip, and the resistor R7 is connected to OUTP pin of the E6308 chip.

Further, the conditioning circuit for adjusting the data accuracy of the sensor comprises ADA4528-2TCPZ chip and a capacitor C11, one end of the capacitor C11 is connected to V+ pin of the ADA4528-2TCPZ chip, the other end thereof is connected to the capacitor C53 of the 9V power to 5V power circuit, OUTA pin and −INA pin of the ADA4528-2TCPZ chip are connected in parallel, +INA pin of the ADA4528-2TCPZ chip is connected to OUTP pin of the E6308 chip through the resistor R7, and +INB pin of the ADA4528-2TCPZ chip is connected to OUTN pin of the E6308 chip through the resistor R76.

Further, the analog-digital conversion module comprises AD7766 chip, a resistor R41, a resistor R45, a capacitor C71, a capacitor C80, a capacitor C57, a capacitor C72 and a capacitor C73, a first pin of the J39 socket is connected to the capacitor C7 of the 12V power to 9V power circuit, a second pin of the J39 socket is connected to VIN+pin of the AD7766 chip through the resistor R41, a third pin of the J39 socket is connected to VIN−pin of the AD7766 chip through the resistor R45, and a fourth pin of the J39 socket is connected to the analog signal ground GND, and VRef+pin of the AD7766 chip is connected to the capacitor C71 and the capacitor C53 of the 9V power to 5V power circuit respectively, the capacitor C80 and the capacitor C57 are connected in parallel, and one end of the circuit thereafter is connected to AVdd pin of the AD7766 chip, the other end is connected to the analog signal ground GND; AVdd pin of the AD7766 chip is connected to the capacitor C23 of the 9V power to the 2.5V power circuit, DVdd pin of the AD7766 chip is connected to the capacitor C23 of the 9V power to the 2.5V power circuit and the capacitor C72 respectively, and Vdrive pin of the AD7766 chip is connected to the capacitor C20 of the 9V power to the 3.3V power circuit and the capacitor C73 respectively.

Further, the analog and digital signal isolation module comprises ADUM3151A chip, ACPL_M61 chip, a capacitor C89, a resistor R70, a resistor R71, a resistor R72, a resistor R73, a resistor R79, a capacitor C95, a resistor R48, a resistor R74, a resistor R77, a resistor R78, and a capacitor C96, VDD pin of the ACPL_M61 chip is connected to VDD1 pin of the ADUM3151A chip, the resistor R74 is connected to Anode pin of the ACPL_M61 chip, the resistor R77 is connected to Cathode pin of the ACPL_M61 chip, and the resistor R78 is connected to VO pin of the ACPL_M61 chip, VDD2 pin of the ADUM3151A chip is connected to Vdrive pin of the AD7766 chip, the capacitor C89 is connected to VDD2 pin of the ADUM3151A chip, the resistor R70 is connected to SCLK pin of the ADUM3151A chip, the resistor R71 is connected to SO pin of the ADUM3151A chip, the resistor R72 is connected to nSSS pin of the ADUM3151A chip, the resistor R73 is connected to VOA pin of the ADUM3151A chip, the resistor R79 is connected to VOB pin of the ADUM3151A chip, the capacitor C95 is connected to VDD1 pin of the ADUM3151A chip, and the resistor R48 is connected to VIB pin of the ADUM3151A chip.

Further, two first fixing plates are vertically arranged on the right side of the baseplate, and two first fixing plates are arranged side by side, two second fixing plates are vertically arranged on the lower side of the baseplate, and two second fixing plates are arranged side by side, the first circuit board is fixed on two second fixing plates, the second circuit board is fixed on two first fixing plates, the third circuit board is fixed on the surface of the baseplate, and the first circuit board, the second circuit board and the third circuit board are perpendicular to each other.

Further, a circuit hole is arranged on the shell, the circuits on the first circuit board, the second circuit board and the third circuit board are screwed together and then passed through the circuit hole.

Further, a filtering processing is proceed on acceleration data acquired by the three-axis acceleration sensor to decrease interference from external interference signals, the filtering processing specifically comprises: the filtering process specifically comprising: performing a 50 hz notch filtering algorithm on the acquired acceleration initial data by using a sampling rate of 2000 hz:

$y_{50}(k) = -A(1,2)*y_{50}(k-1) - A(1,3)*y_{50}(k-2) + B(1,1)*x(k) + B(1,2)*x(k-1) + B(1,3)*x(k-2)$ wherein x(k) is initial value of the acceleration sampling at time k, and $y_{50}(k)$ is acceleration data after the 50 hz notch filtering;

$$B_{1\times 3} = \left[1, -2*\cos\left(\frac{\omega_0}{\omega_f}*2\pi\right), 1\right];$$

$$A_{1\times 3} = \left[1, -2*\alpha*\cos\left(\frac{\omega_0}{\omega_f}*2\pi\right), \alpha^2\right];$$

A(i, j) refers to data on the ith row and jth column of matrix A; B(i, j) refers to data on the ith row and jth column of matrix B; $\Omega_0$ refers to notch frequency of notch filter, which is taken 50 hz, $\Omega_f$ refers to signal sampling frequency, α refers to notch filter coefficient, which is taken 0.9;

then, performing a 100 hz notch filtering algorithm on the acceleration data after the 50 hz notch filtering algorithm;

$y_{100} = -C(1,2)*y_{100}(k-1) - C(1,3)*y_{100}(k-2) + D(1,1)*y_{50}(k) + D(1,2)*y_{50}(k-1) + D(1,3)*y_{50}(k-2)$ wherein $y_{100}{}^{(k)}$ is acceleration data after the 100 hz notch filtering;

$$C_{1\times 3} = \left[1, -2*\cos\left(\frac{\omega_1}{\omega_f}*2\pi\right), 1\right];$$

$$D_{1\times 3} = \left[1, -2*\alpha*\cos\left(\frac{\omega_1}{\omega_f}*2\pi\right), \alpha^2\right];$$

wherein C(i,j) refers to data on the ith row and jth column of matrix C; D(i,j) refers to data on the ith row and jth column of matrix D; $\Omega_1$ refers to notch frequency of notch filter, which is taken 100 hz, $\Omega_f$ refers to signal sampling frequency, α refers to notch filter coefficient, which is taken 0.9;

finally, the acceleration data after the 100 hz notch filtering is passed through a second-order chebyshev low-pass filter with a cutoff frequency of 120 hz, three-axis acceleration data is obtained by three-axis acceleration data of the second-order chebyshev low-pass filter using one time integral, and elevator location information is obtained by three-axis acceleration data of the second-order chebyshev low-pass filter using double time integration.

The beneficial effect of the invention are as follows: the invention is not only portable, but also provided with a power isolation module, a power circuit conversion module and an analog and digital signal isolation module in the elevator vibration data acquisition circuit, the power isolation module isolates an external power supply and the power supply of the equipment, which improves signal-noise ratio of the elevator vibration data acquisition circuit and also has the function of reducing noise, the analog and digital signal isolation module completely isolates the digital signals and the analog signals, which may improve the accuracy of the data collected by the elevator vibration data acquisition circuit; in addition, the three-axis acceleration sensor is obtained by that acceleration sensor modules on three circuit boards being fixed inside the metal housing strictly as the directions of X, Y, and Z axis; the output of differential signal with sensitivity of the sensors from three directions can be realized; which can solve the problem in application of prior art that the sensor is difficult to fix in three directions; impedance characters of the sensor signals may be improved after passing through the conditioning circuit. In addition, a filtering processing is proceed on acceleration data acquired by the three-axis acceleration sensor to decrease interference from external interference signals, thereby improving the accuracy of the acceleration data, moreover, the invention has handrail vibration detection

DESCRIPTION OF THE PREFERRED EMBODIMENTS

The invention is further described below with the attached pictures.

Figure 1:
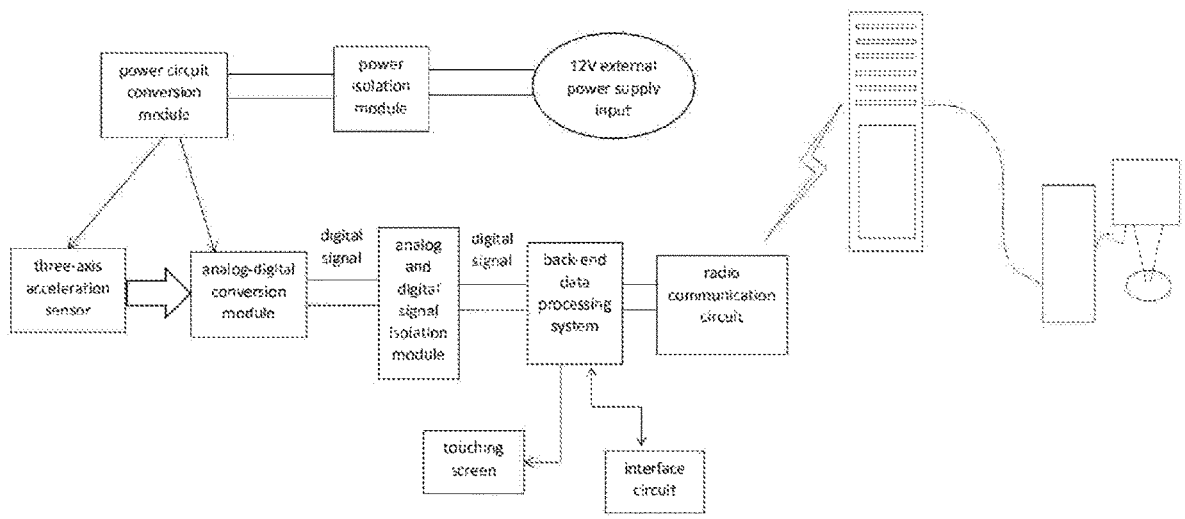
FIG. 1 shows the structure diagram of the circuit in the invention.
Figure 2:
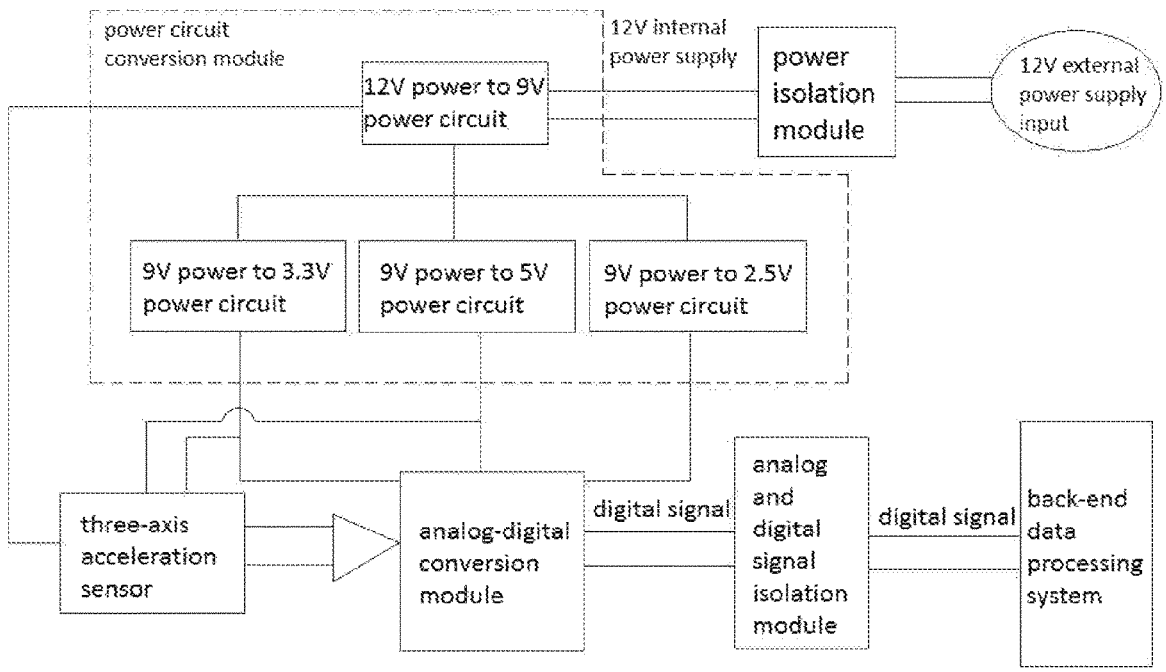
FIG. 2 shows the detailed structure diagram of the circuit in the invention.
Figure 3:
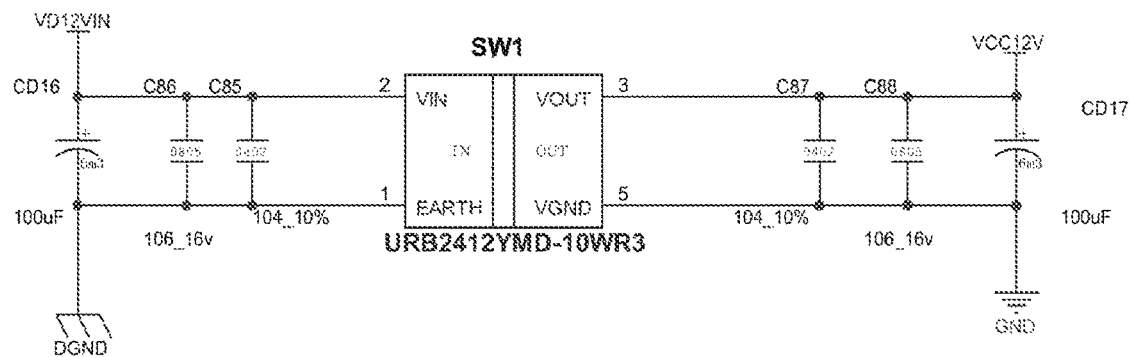
FIG. 3 shows the detailed structure diagram of the power isolation module in the invention.
Figure 4:
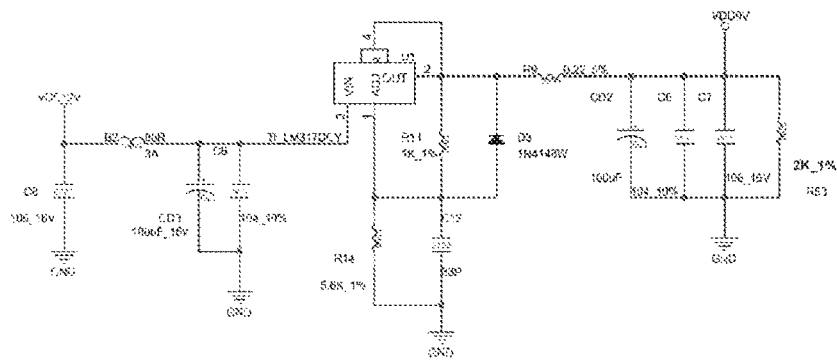
FIG. 4 shows the detailed structure diagram of the power circuit conversion module in the invention.
Figure 4:
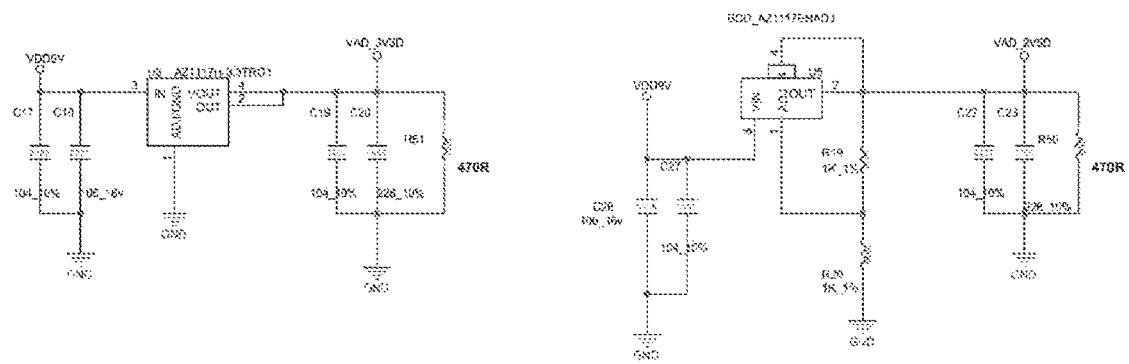
Figure 4:
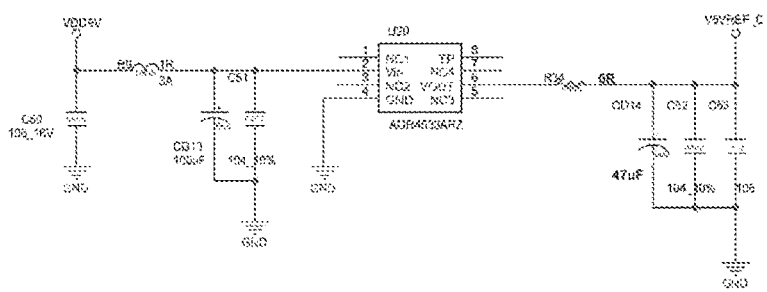
Figure 5:
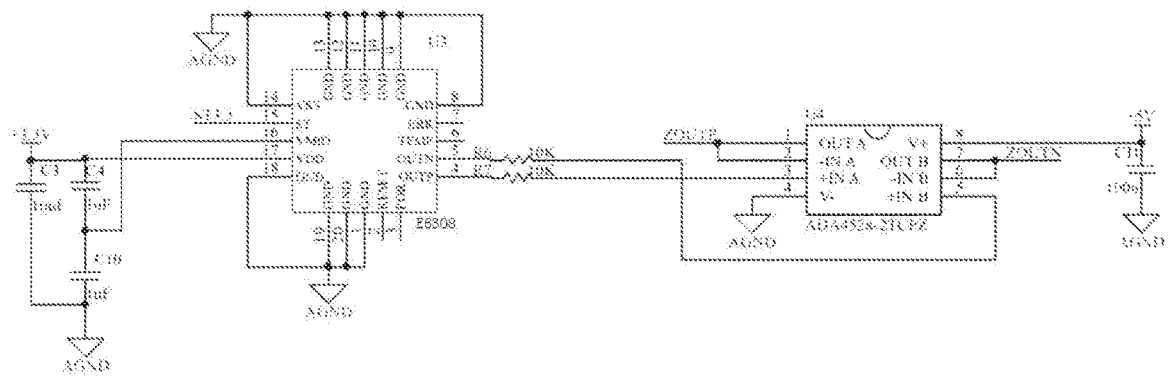
FIG. 5 shows the detailed structure diagram of the connection between the sensors and the conditioning circuit in the invention.
Figure 6:
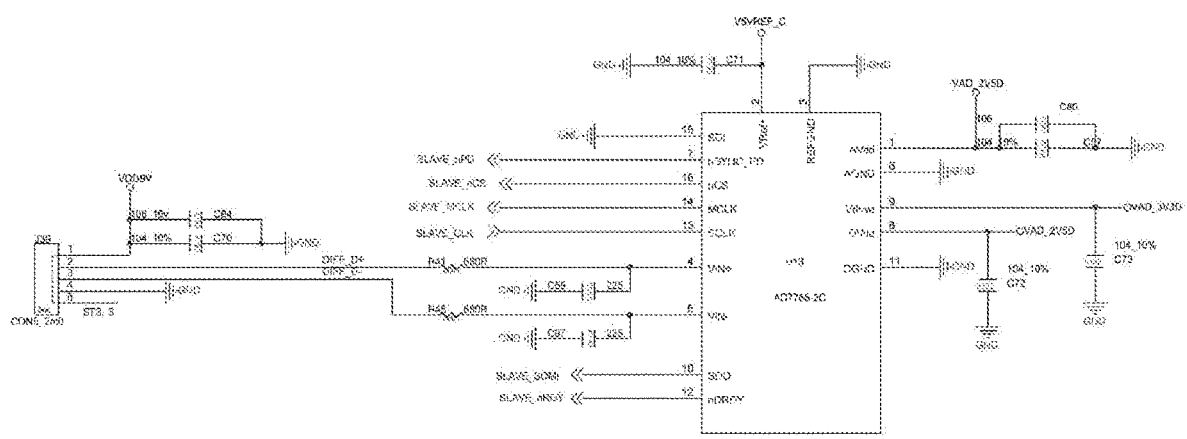
FIG. 6 shows the detailed structure diagram of the analog-digital conversion module in the invention.
Figure 7:
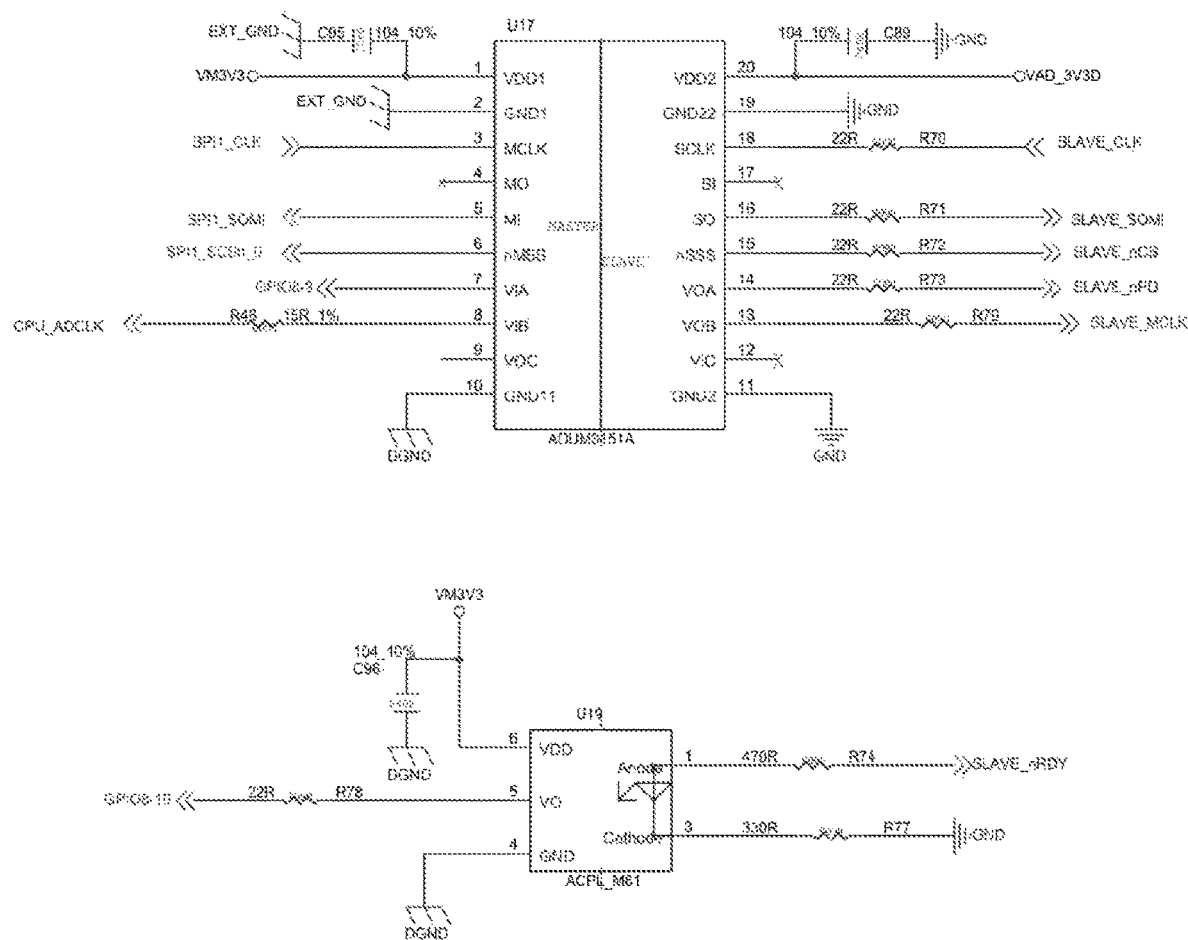
FIG. 7 shows the detailed structure diagram of the analog and digital signal isolation module in the invention.
Figure 8:
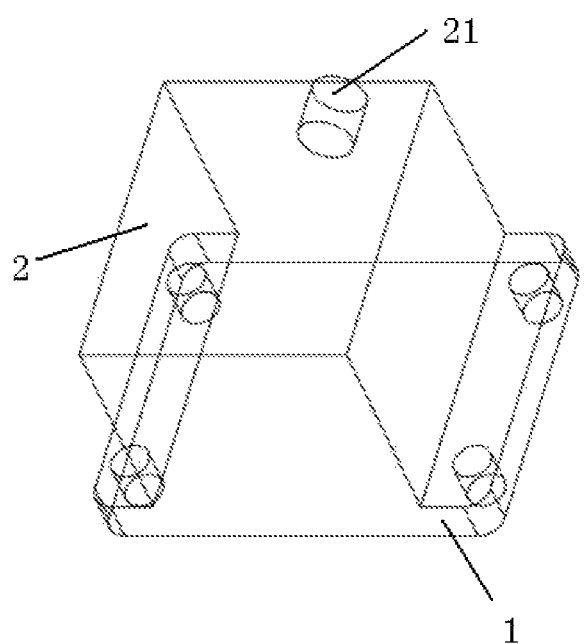
FIG. 8 shows the structure diagram of the baseplate and casing assembled together in the invention.
Figure 9:
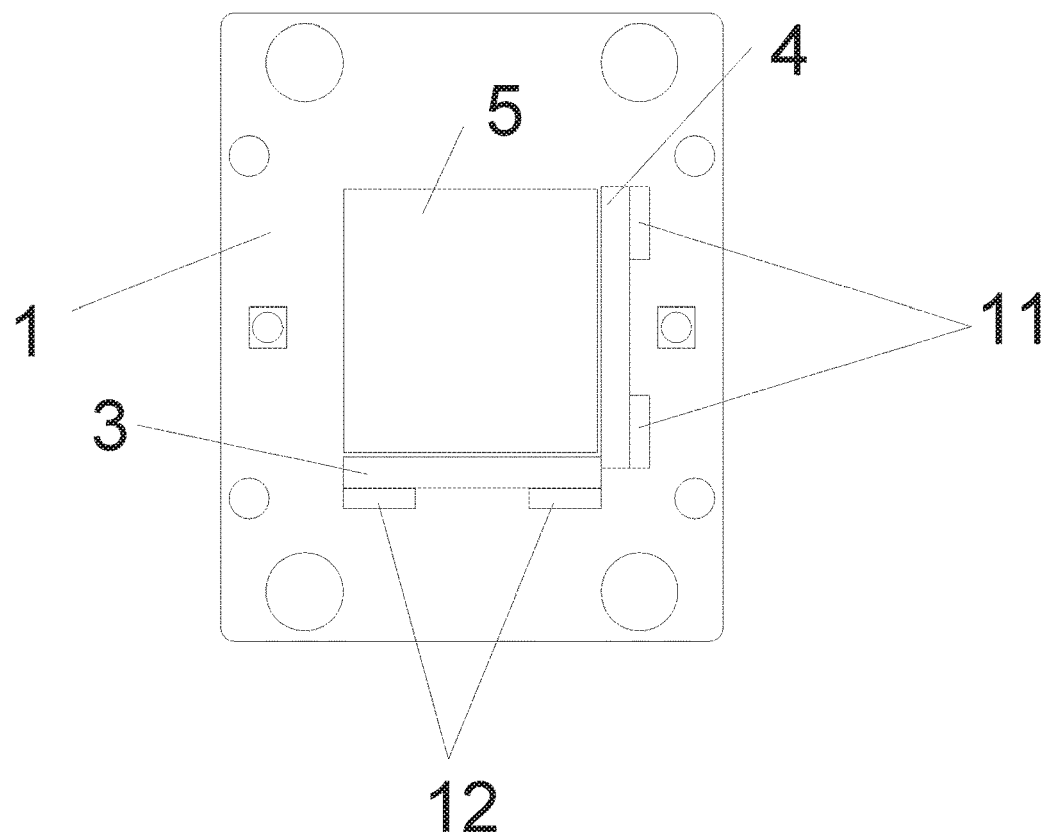
FIG. 9 shows the top view of the baseplate in the invention.
Figure 10:
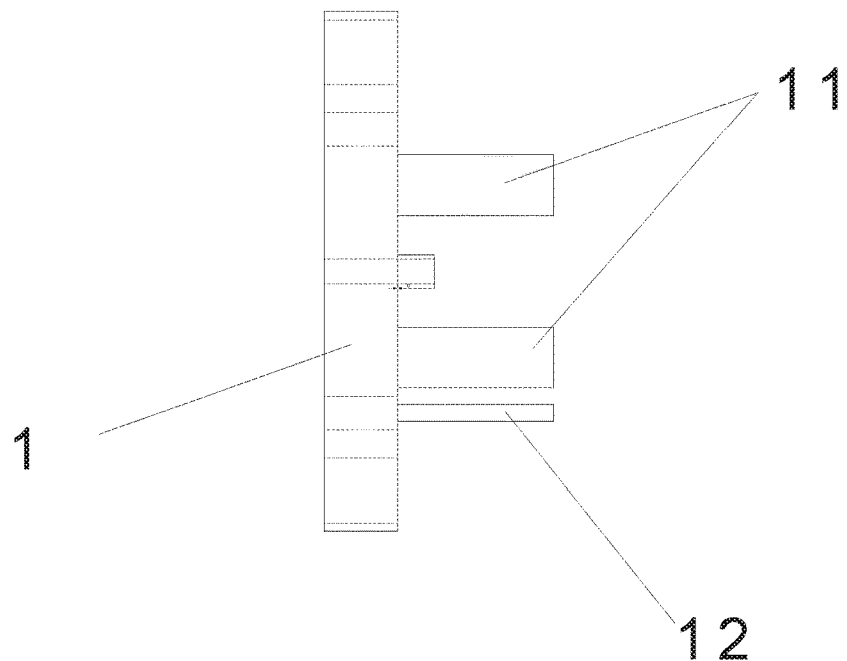
FIG. 10 shows the side structure of the baseplate in the invention.
Figure 11:
FIG. 11 shows the side structure of the shell in the invention.
Figure 12:
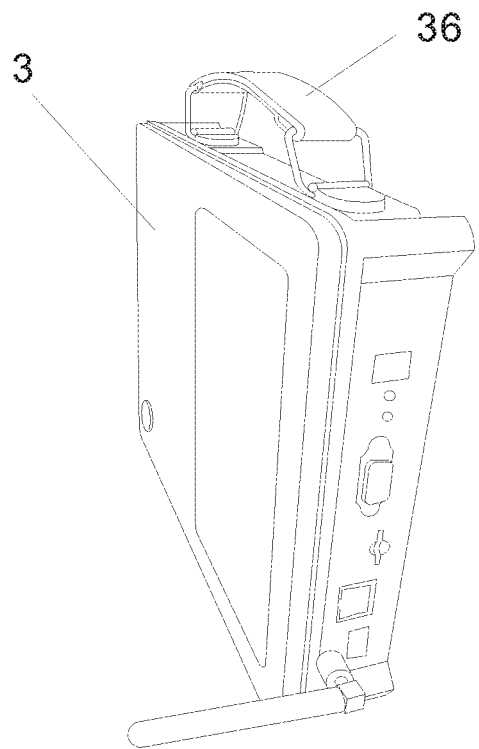
FIG. 12 shows the complete machine appearance of the embodiment of the invention.
Figure 13:
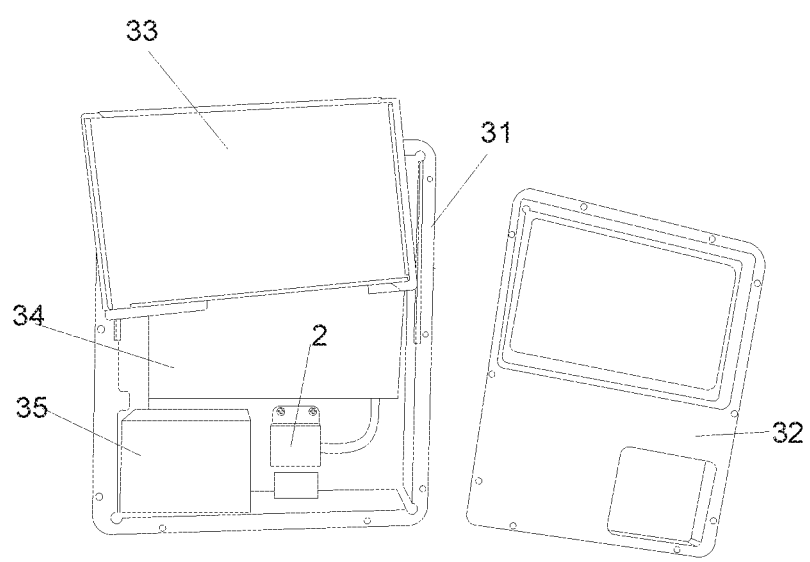
FIG. 13 shows the structure diagram after the covering of the embodiment of the invention is opened.

As shown in FIG. 1-18, an elevator operation quality tester, comprising a rectangle aluminium-alloy housing, the rectangle aluminium-alloy housing comprises a casing 31 and a covering 32, an upper opening of the casing is provided with a groove for embedding in a touching screen 33; a circuit board 34, a three-axis acceleration sensor 2 and a rechargeable battery 35 supplying power to the circuit board are provided in the casing; the circuit board is provide with elevator vibration data acquisition circuit, back-end data processing system, interface circuit and radio communication circuit; the casing is provided with a handle 36 on the side; the elevator vibration data acquisition circuit is connected to the back-end data processing system, the elevator vibration data acquisition circuit comprises a power isolation module, a power circuit conversion module, a three-axis acceleration sensor, an analog and digital signal isolation module and a analog-digital conversion module, the power isolation module isolates an external power supply, and the power isolation module is connected to the power circuit conversion module, the power circuit conversion module converts the 12V power into a power supply voltage required by the three-axis acceleration sensor and a power supply voltage required by the analog-digital conversion module, the three-axis acceleration sensor converts the acquired analog signal data into digital signal data through the analog-digital conversion module, the analog and digital signal isolation module is connected to the analog-digital conversion module and the back-end data processing system respectively, and the analog and digital signal isolation module is configured to prevent noise of the back-end data processing system from being transmitted to the elevator vibration data acquisition circuit through conduction, thereby reducing noise interference to the elevator vibration data acquisition circuit; wherein the whole circuit diagram in FIG. 1 is divided into two parts, the left side and the right side; that is, the left side is the elevator vibration data acquisition circuit, and the right side is the back-end data processing system; the two parts on the left and right and the external power supply are isolated by the power isolation module (URB2412YMD-10WR3 from MORNSUN); and the communication signals from the left and right side are isolated by the ADUM3151A chip and ACPL-M61 chip in the analog and digital signal isolation module; thereby the ground wires on the left and right side are completely insulated; and the noise of the back-end data processing system on the right side may not be transmitted to the acquisition circuit on the left side through conduction; thereby reducing noise interference to the left side circuit signal acquisition; and improving signal-noise ratio of the data acquisition circuit of the system. The three-axis acceleration sensor comprises a baseplate 1 and a shell 2 covered on the baseplate 1, a first circuit board 3 is fixedly arranged in the x-axis direction of the baseplate 1, a second circuit board 4 is fixedly arranged in the y-axis direction of the baseplate 1, and a third circuit board 5 is fixedly arranged in the z-axis direction of the baseplate 1, the first circuit board 3, the second circuit board 4 and the third circuit board 5 are formed a structure of being perpendicular each other, the first circuit board, the second circuit board and the third circuit board are all provided with an acceleration sensor module and a conditioning circuit for adjusting the data accuracy of the sensor, the conditioning circuit is connected to the acceleration sensor module, the acceleration sensor module on the first circuit board, the acceleration sensor module on the second circuit board, and the acceleration sensor module on the third circuit board are formed an acceleration signal for measuring three directions of the x-axis, the y-axis, and the z-axis; therefore a high-precision acceleration sensor fixed box can be made. Wherein, taking the center point of the baseplate as 0 point to form a coordinate system, thereby the baseplate forming three directions of x-axis, y-axis, and z-axis;

In the embodiment, the back-end data processing system adopts AM3358 embedded processor, the embedded processor is the core component of the tester, which can implement the operating environment of the Linux operating system and the running of the tester application, complete the data communication with the signal acquisition module, signal data processing and analysis and data storage and management, and the embedded processor can also support for TCP/IP data communication protocol and other functions. The processor has low power consumption, rich peripheral interfaces, and integrated ARM Cortex-A8 core AM3358 processor as the development board, which has a length of 86.36 inm, a width of 54.61 mm, and the operating current of 0.35 A.

Figure 16:
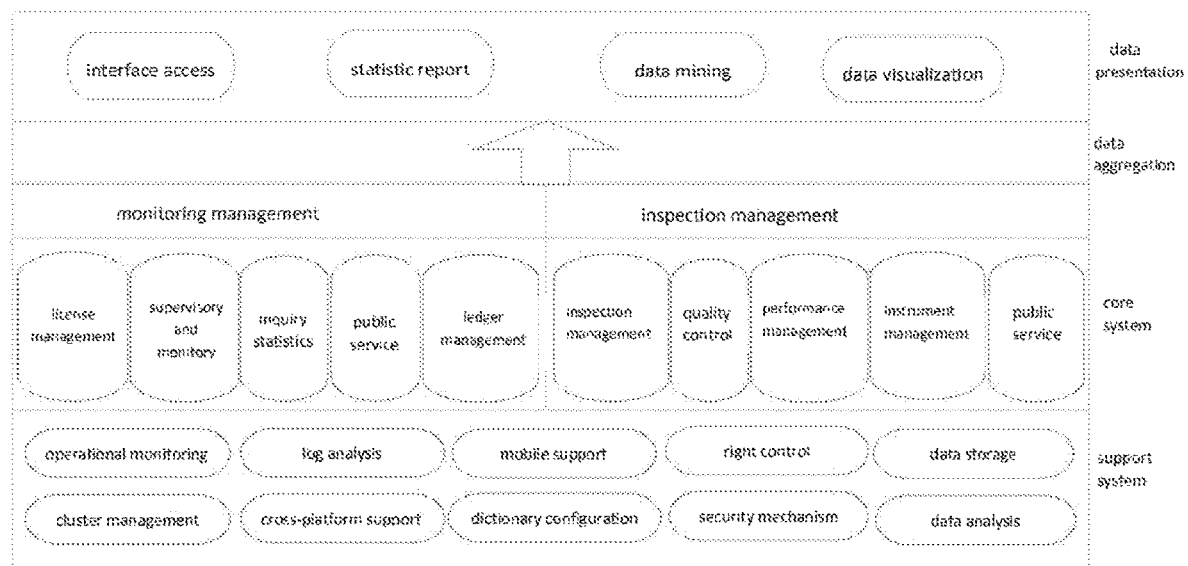
FIG. 16 shows a system structure diagram of the integrated platform for inspection and monitoring of special equipment in the embodiment of the invention.

In addition, in the embodiment, the wireless communication circuit communicates with the integrated platform for inspection and monitoring of special equipment through the wireless network. The communication of the integrated platform for inspection and monitoring of special equipment mainly consists of two cores of inspection management and monitoring management, and integrated management platform integrating four layers of system layer, core system layer, data aggregation layer and data display layer; the data collected by the elevator carriage quality tester will be fed back to the platform for further analysis and judgment by the comprehensive personnel; the architecture diagram of the platform is shown in FIG. 16.

Figure 14:
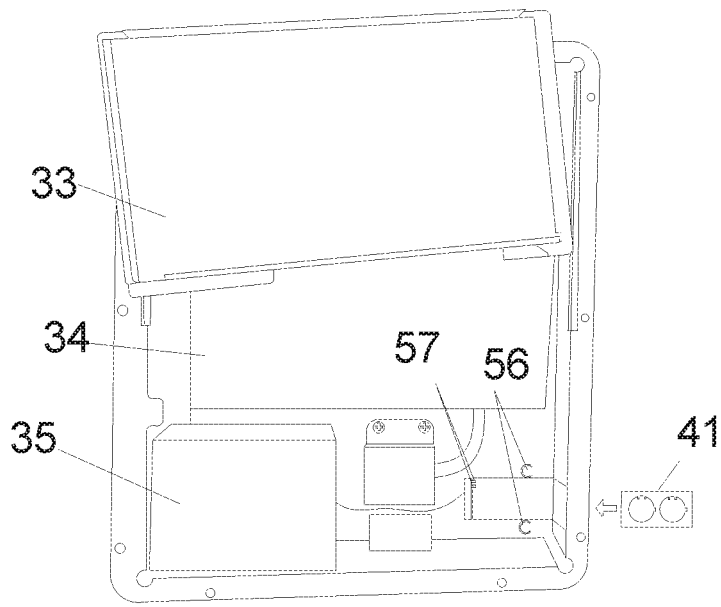
FIG. 14 shows the structure diagram after the covering of the other embodiment of the invention is opened.
Figure 15:
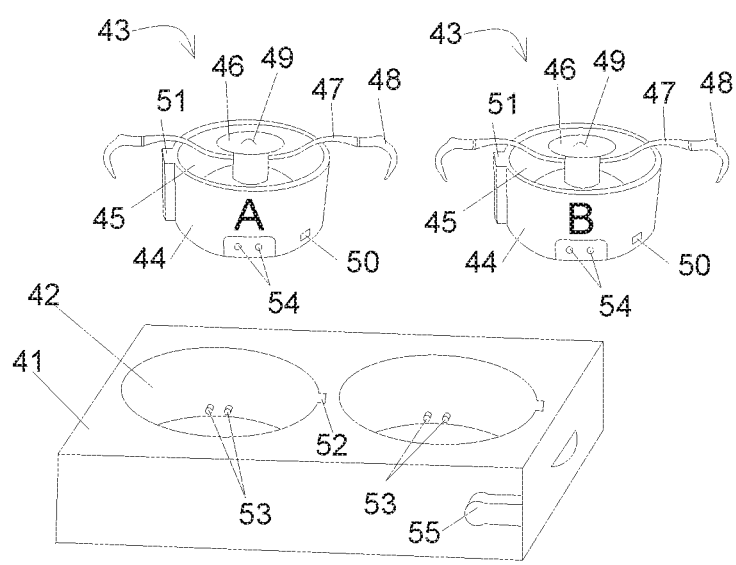
FIG. 15 shows the structure diagram of the embodiment provided with Bluetooth wireless vibration identification device of the invention.

As shown in FIG. 14 and FIG. 15, the casing is provided with a drawer 41 on the side, two grooves 42 are provided on the drawer 41, a vibration identification device 43 is provided in each groove, the vibration identification device A and B all both comprise a tubbiness shell 44, a receiving groove 45 is provided on the tubbiness shell 44, a rotary column 46 is provided in the receiving groove 45, an elastic stretching fixing rope 47 is symmetrically arranged on the rotary column 46, a hook 48 for hooking handrail belt of escalator is provided on the end of the elastic stretching fixing rope 47; a rotary handle 49 is provided on the rotary column 46; the tubbiness shell 44 is provided with a rechargeable battery and a circuit board powered by the rechargeable battery; the circuit board is provided with a MCU, the MCU is connected to a vibrating sensor and a bluetooth communication module; in the embodiment, the MCU interacts with the tester via Bluetooth communication module; the circuit board is further provided with a charging and discharging circuit, a power supply end of the charging and discharging circuit is connected to the positive and negative electrodes on the sidewall of the tubbiness shell 44; a switch button 50 is provided on the tubbiness shell 44; and the tubbiness shell 44 is provided with a limiting convex portion 51 corresponding to a limiting concave portion 52 on the sidewall of the groove; positive and negative electrode columns 53 are provided in the grooves, the positive and negative electrode columns 53 are respectively correspond to positive and negative electrodes 54; a clamping part 55 is arranged on the sidewall of the drawer 41 for the drawing and clamping of the drawer. With reference to FIG. 14 and FIG. 15, the bottom of the casing and the corresponding position of the drawer 41 are provided with a clamping portion 56 that cooperates with the clamping part 55, in the embodiment, the cross section of the clamping part 55 is formed by a circle and a rectangle, and the clamping portion 56 is a curved groove; a charging column 57 (that is the power supply end of the charging and discharging circuit mentioned above) connected to the rechargeable battery 35 is arranged on the bottom of the drawer on the casing, and is used for providing power supply to the vibration identification device though electrical connection when the drawer is closed; in the embodiment, the vibration identification device 43 can also test the vibration data of the escalator handrail, when in use, the vibration identification device 43 can hook both sides of handrail belt of escalator by a hook on the elastic stretching fixing rope, during the test, the vibration identification device transmits the detected data to the tester through Bluetooth, and when the tester is not in use, the user can rotate the rotary column 46, collect the elastic stretching fixing rope in the receiving groove 45, and put the vibration identification device 43 on the groove, the tester automatically charges the vibration recognition device 43 when the drawer 41 is closed.

In the invention, the power isolation module comprises a power module URB2412YMD-10WR3, a capacitor C87, a capacitor C88, an electrolytic capacitor CD17, a capacitor C86, a capacitor C85, and an electrolytic capacitor CD16, the capacitor C87, capacitor C88 and the electrolytic capacitor CD17 are connected in parallel, one end of the electrolytic capacitor CD17 is connected to an internal power supply, the other of the electrolytic capacitor CD17 is connected to analog signal ground GND, one end of the capacitor C87 is connected to VOUT pin of the power module URB2412YMD-10WR3, the other end of the capacitor C87 is connected to VGND pin of the power module URB2412YMD-10WR3, the capacitor C86, the capacitor C85 and the electrolytic capacitor CD16 are connected in parallel, one end of the electrolytic capacitor CD16 is connected to an outer power supply, the other of the electrolytic capacitor CD16 is connected to digital signal ground DGND, one end of the capacitor C85 is connected to VIN pin of the power module URB2412YMD-10WR3, the other of the capacitor C85 is connected to EARTH pin of the power module URB2412YMD-10WR3.

The power circuit conversion module comprises 12V power to 9V power circuit, 9V power to 3.3V power circuit, 9V power to 2.5V power circuit and 9V power to 5V power circuit, the 12V power to 9V power circuit is connected to the power isolation module, one end of the 9V power to 3.3V power circuit, the 9V power to 2.5V power circuit and the 9V power to 5V power circuit are all connected to the 12V power to 9V power circuit, the other end of the 9V power to 3.3V power circuit, the 9V power to 2.5V power circuit and the 9V power to 5V power circuit are all connected to the analog-digital conversion module, and the three-axis acceleration sensor is connected to the 9V power to 3.3V power circuit.

The 12V power to 9V power circuit comprises LM317DCY chip, a capacitor C8, a chip inductor B2, an electrolytic capacitor CD3, a capacitor C9, a resistor R14, a capacitor C12, a resistor R11, a diode D3, a resistor R9, an electrolytic capacitor CD2, a capacitor C6, a capacitor C7, and a resistor R953; the electrolytic capacitor CD3 and the capacitor C9 are connected in parallel, and one end of the circuit thereafter is connected to the capacitor C8 and the chip inductor B2 in series, the other end is connected to VIN pin of the LM317DCY chip; the capacitor C8 is connected to an internal power supply of the power isolation module, the resistor R14 and the capacitor C12 are connected in parallel, and one end of the circuit thereafter is connected to ADJ pin of the LM317DCY chip, the other end is connected to analog signal ground GND; the resistor R11 and the diode D3 are connected in parallel, and one end of the circuit thereafter is connected to OUT pin of the LM317DCY chip, the other end is connected to the capacitor C12; the electrolytic capacitor CD2, the capacitor C6, the capacitor C7 and the resistor R953 are connected in parallel, and one end of the circuit thereafter is connected to one end of the resistor R9, the other end is connected to analog signal ground GND; the other end of the resistor R9 is connected to the diode D3; the 12V power to 9V power circuit supplies power to the three-axis acceleration sensor, and also supplies power to the 9V power to 3.3V power circuit, the 9V power to 2.5V power circuit and the 9V power to 5V power circuit.

The 9V power to 3.3V power circuit comprises AZ1117H-3.3TRG1 chip, a capacitor C17, a capacitor C18, a capacitor C19, a capacitor C20 and a resistor R15, the capacitor C17 and the capacitor C18 are connected in parallel, and one end of the circuit thereafter is connected to the capacitor C7 of the 12V power to 9V power circuit, the other end is connected to IN pin of the AZ1117H-3.3TRG1 chip, VOUT pin of the AZ1117H-3.3TRG1 chip is connected to OUT pin in parallel, the capacitor C19, the capacitor C20 and the resistor R51 are connected in parallel, and one end of the circuit thereafter is connected to VOUT pin of the AZ1117H-3.3TRG1 chip, the other end is connected to the analog signal ground GND;

the 9V power to 2.5V power circuit comprises AZ1117EHADJ chip, a capacitor C26, a capacitor C27, a resistor R19, a resistor R20, a capacitor C22, a capacitor C23 and a resistor R50, the capacitor C26 and the capacitor C27 are connected in parallel, and one end of the circuit thereafter is connected to the capacitor C7 of the 12V power to 9V power circuit, the other end is connected to VIN pin of the AZ1117EHADJ chip; the resistor 19 and the resistor R20 are connected in series, one end of the resistor R20 is connected to ADJ pin of the AZ1117EHADJ chip, the other end thereof is connected to OUT pin of the AZ1117EHADJ chip; the capacitor C22, the capacitor C23 and the resistor R50 are connected in parallel, and one end of the circuit thereafter is connected to OUT pin of the AZ1117EHADJ chip, the other end is connected to the analog signal ground GND;

the 9V power to 2.5V power circuit comprises ADR4533ARZ chip, a capacitor C50, a chip inductor B9, an electrolytic capacitor CD13, a capacitor C51, a resistor R34, an electrolytic capacitor CD14, a capacitor C52 and a capacitor C53, the electrolytic capacitor CD13 and the capacitor C51 are connected in parallel, and one end of the circuit thereafter is connected to the capacitor C50 and the chip inductor B9 in series, the other end is connected to Vin pin of the ADR4533ARZ chip; the electrolytic capacitor CD14, the capacitor C52 and the capacitor C53 are connected in parallel, and one end of the circuit thereafter is connected to the resistor R34, the other end is connected to the analog signal ground GND, and the resistor R34 is connected to VOUT pin of the ADR4533ARZ chip.

For the AD7766 chip needs to use three power supplies, thereby the invention provides a 9V power to 3.3V power circuit, a 9V power to 2.5V power circuit and a 9V power to 5V power circuit, which have a reference voltage of 3.3V, 2.5V and 5V respectively; the conversion from 9V to 3.3V is achieved by AZ1117-3.3TRG1, the power conversion from 9V to 2.5v is achieved by AZ1117EHADJ, the conversion of reference voltage from 9V to 5V is achieved by the ultra low noise and the high-precision reference voltage source chip of the ADR4533ARZ chip. In addition, the 9V power to the 3.3V power circuit also supplies power to the sensor in the three-axis acceleration sensor, and the 9V power to the 5V power circuit supplies power to the conditioning circuit in the three-axis acceleration sensor.

The acceleration sensor module comprises J39 socket and a sensor, the sensor is connected to the J39 socket, the sensor comprises E6308 chip, a capacitor C3, a capacitor C4, a capacitor C10, a resistor R6 and a resistor R7, the capacitor C4 is connected in series with the capacitor C10 and is connected in parallel with the capacitor C3 thereafter, the capacitor C3 is connected to the capacitor C20 of the AZ1117H-3.3TRG1 chip, a fifth pin of the J39 socket is connected to ST pin of the E6308 chip, one end of the capacitor C4 is connected to VDD pin of the E6308 chip, and the other end thereof is connected to VMID pin of the E6308 chip; the resistor R6 is connected to OUTN pin of the E6308 chip, and the resistor R7 is connected to OUTP pin of the E6308 chip;

The conditioning circuit for adjusting the data accuracy of the sensor comprises ADA4528-2TCPZ chip and a capacitor C11, one end of the capacitor C11 is connected to V+pin of the ADA4528-2TCPZ chip, the other end thereof is connected to the capacitor C53 of the 9V power to 5V power circuit, OUTA pin and −INA pin of the ADA4528-2TCPZ chip are connected in parallel, +INA pin of the ADA4528-2TCPZ chip is connected to OUTP pin of the E6308 chip through the resistor R7, and +INB pin of the ADA4528-2TCPZ chip is connected to OUTN pin of the E6308 chip through the resistor R76. Wherein, a fourth pin and a fifth pin of the E6308 chip are the positive and negative ends of the analog voltage differential output signal of the acceleration sensor; the differential signal is connected to a single-channel high-precision operational amplifier chip from ADI company (Analog Devices, Inc.) with ultra low noise and zero drift as the differential voltage output conditioning chip ADA4528-2TCPZ; a first pin and a seventh pin of the ADA4528-2TCPZ chip are the positive and negative electrodes of the differential output after the conditioning of the operational amplifier.

The analog-digital conversion module comprises AD7766 chip, a resistor R41, a resistor R45, a capacitor C71, a capacitor C80, a capacitor C57, a capacitor C72 and a capacitor C73, a first pin of the J39 socket is connected to the capacitor C7 of the 12V power to 9V power circuit, a second pin of the J39 socket is connected to VIN+pin of the AD7766 chip through the resistor R41, a third pin of the J39 socket is connected to VIN−pin of the AD7766 chip through the resistor R45, and a fourth pin of the J39 socket is connected to the analog signal ground GND, and VRef+pin of the AD7766 chip is connected to the capacitor C71 and the capacitor C53 of the 9V power to 5V power circuit respectively, the capacitor C80 and the capacitor C57 are connected in parallel, and one end of the circuit thereafter is connected to AVdd pin of the AD7766 chip, the other end is connected to the analog signal ground GND; AVdd pin of the AD7766 chip is connected to the capacitor C23 of the 9V power to the 2.5V power circuit, DVdd pin of the AD7766 chip is connected to the capacitor C23 of the 9V power to the 2.5V power circuit and the capacitor C72 respectively, and Vdrive pin of the AD7766 chip is connected to the capacitor C20 of the 9V power to the 3.3V power circuit and the capacitor C73 respectively.

Wherein the J39 socket is the socket connected to the analog signal differential output of the three-axis acceleration sensor; the three-axis acceleration sensor is powered by a 9V power supply; and the data of the three-axis acceleration sensor is transmitted through the analog differential signal; connecting the sensor analog differential signal to 24 bit ADC conversion chip AD7766; thereby achieving the purpose of converting analog differential signal to digital signal on the SPI interface. A fifth pin ST3.3V of the J39 socket is a reserved self-detection signal for acceleration sensor, which is directly connected to the corresponding self-detection function pin of the acceleration sensor.

The analog and digital signal isolation module comprises ADUM3151A chip, ACPL_M61 chip, a capacitor C89, a resistor R70, a resistor R71, a resistor R72, a resistor R73, a resistor R79, a capacitor C95, a resistor R48, a resistor R74, a resistor R77, a resistor R78, and a capacitor C96, VDD pin of the ACPL_M61 chip is connected to VDD1 pin of the ADUM3151A chip, the resistor R74 is connected to Anode pin of the ACPL_M61 chip, the resistor R77 is connected to Cathode pin of the ACPL_M61 chip, and the resistor R78 is connected to VO pin of the ACPL_M61 chip, VDD2 pin of the ADUM3151A chip is connected to Vdrive pin of the AD7766 chip, the capacitor C89 is connected to VDD2 pin of the ADUM3151A chip, the resistor R70 is connected to SCLK pin of the ADUM3151A chip, the resistor R71 is connected to SO pin of the ADUM3151A chip, the resistor R72 is connected to nSSS pin of the ADUM3151A chip, the resistor R73 is connected to VOA pin of the ADUM3151A chip, the resistor R79 is connected to VOB pin of the ADUM3151A chip, the capacitor C95 is connected to VDD1 pin of the ADUM3151A chip, and the resistor R48 is connected to VIB pin of the ADUM3151A chip. The analog and digital signal isolation module is configured to prevent noise of the back-end data processing system from being transmitted to the elevator vibration data acquisition circuit through conduction, thereby reducing noise interference to the elevator vibration data acquisition circuit.

Two first fixing plates 11 are vertically arranged on the right side of the baseplate 1, and two first fixing plates 11 are arranged side by side, two second fixing plates 12 are vertically arranged on the lower side of the baseplate 1, and two second fixing plates 12 are arranged side by side, the first circuit board 3 is fixed on two second fixing plates 12, the second circuit board 4 is fixed on two first fixing plates 11, the third circuit board 5 is fixed on the surface of the baseplate 1, and the first circuit board, the second circuit board and the third circuit board are perpendicular to each other. Therefore, the first circuit board, the second circuit board, and the third circuit board can be more stably arranged in the baseplate 1 and the shell. A circuit hole 21 is arranged on the shell 2, the circuits on the first circuit board, the second circuit board and the third circuit board are screwed together and then passed through the circuit hole 21.

A filtering processing is proceed on acceleration data acquired by the three-axis acceleration sensor to decrease interference from external interference signals, the filtering processing specifically comprises: the filtering process specifically comprising: performing a 50 hz notch filtering algorithm on the acquired acceleration initial data by using a sampling rate of 2000 hz:

$y_{50}(k)=-A(1,2)*y_{50}(k-1)-A(1,3)*y_{50}(k-2)+B(1,1)*x(k)+B(1,2)*x(k-1)+B(1,3)*x(k-2)$, wherein $x(k)$ is initial value of the acceleration sampling at time k, and $y_{50}(k)$ is acceleration data after the 50 hz notch filtering;

$$B_{1\times 3} = \left[1\ -2*\cos\left(\frac{\omega_0}{\omega_f}*2\pi\right),\ 1\right];$$

$$A_{1\times 3} = \left[1\ -2*\alpha*\cos\left(\frac{\omega_0}{\omega_f}*2\pi\right),\ \alpha^2\right];$$

wherein $A(i,j)$ refers to data on the ith row and jth column of matrix A; $B(i,j)$ refers to data on the ith row and jth column of matrix B; $\Omega_0$ refers to notch frequency of notch filter, which is taken 50 hz, $\Omega_f$ refers to signal sampling frequency, $\alpha$ refers to notch filter coefficient, which is taken 0.9; that is, $$A(1,2) = -2*\alpha*\cos\left(\frac{\omega_0}{\omega_f}*2\pi\right),$$

$$A(1,3) = \alpha^2;\ B(1,1) = 1;$$

$$B(1,2) = -2*\cos\left(\frac{\omega_0}{\omega_f}*2\pi\right)B(1,3) = 1.$$

then, performing a 100 hz notch filtering algorithm on the acceleration data after the 50 hz notch filtering algorithm;

$y_{100}(k)=-C(1,2)*y_{100}(k-1)-C(1,3)*y_{100}(k-2)+D(1,1)*y_{50}(k)+D(1,2)*y_{50}(k-1)+D(1,3)*y_{50}(k-2)$ wherein $y_{100}(k)$ is acceleration data after the 100 hz notch filtering;

$$C_{1\times 3} = \left[1\ -2*\cos\left(\frac{\omega_1}{\omega_f}*2\pi\right),\ 1\right];$$

$$D_{1\times 3} = \left[1\ -2*\alpha*\cos\left(\frac{\omega_1}{\omega_f}*2\pi\right),\ \alpha^2\right];$$

wherein $C(i,j)$ refers to data on the ith row and jth column of matrix C; $D(i,j)$ refers to data on the ith row and jth column of matrix D; $\Omega_1$ refers to notch frequency of notch filter, which is taken 100 hz, $\Omega_f$ refers to signal sampling frequency, $\alpha$ refers to notch filter coefficient, which is taken 0.9;

finally, the acceleration data after the 100 hz notch filtering is passed through a second-order chebyshev low-pass filter with a cutoff frequency of 120 hz, three-axis acceleration data is obtained by acceleration data of the second-order chebyshev low-pass filter using one time integral, and elevator location information is obtained by acceleration data of the second-order chebyshev low-pass filter using double time integration. Thereby reducing the proportion of interference signals in the useful signals and improving the accuracy of the acceleration data.

In conclusion, the invention is provided with a power isolation module, a power circuit conversion module and an analog and digital signal isolation module in the elevator vibration data acquisition circuit, the power isolation module isolates an external power supply and the power supply of the equipment, which improves signal-noise ratio of the elevator vibration data acquisition circuit and also has the function of reducing noise, the analog and digital signal isolation module completely isolates the digital signals and the analog signals, which may improve the accuracy of the data collected by the elevator vibration data acquisition circuit.

The description above is merely the preferred embodiment of the invention, and any equivalent changes and modifications made in accordance with the scope of the invention should be included within the scope of the invention.

The invention claimed is:

1. An elevator operation quality tester, comprising a rectangle aluminium-alloy housing, the rectangle aluminium-alloy housing comprises a casing and a covering, an upper opening of the casing is provided with a groove for embedding in a touching screen; a circuit board, a three-axis acceleration sensor and a rechargeable battery supplying power to the circuit board are provided in the casing; the circuit board is provide with an elevator vibration data acquisition circuit, back-end data processing system, interface circuit and radio communication circuit; the casing is provided with a handle on a side; the elevator vibration data acquisition circuit is connected to the back-end data processing system, the elevator vibration data acquisition circuit comprises a power isolation module, a power circuit conversion module, the three-axis acceleration sensor, an analog and digital signal isolation module and a analog-digital conversion module, the power isolation module isolates an external power supply, and the power isolation module is connected to the power circuit conversion module, the power circuit conversion module converts a 12V power into a power supply voltage required by the three-axis acceleration sensor and a power supply voltage required by the analog-digital conversion module, the three-axis acceleration sensor acquires analog signal data in three directions of the x-axis, the y-axis, and the z-axis and converts the acquired analog signal data into digital signal data through the analog-digital conversion module, the analog and digital signal isolation module is connected to the analog-digital conversion module and the back-end data processing system respectively, and the analog and digital signal isolation module is configured to prevent noise of the back-end data processing system from being transmitted to the elevator vibration data acquisition circuit through conduction, thereby reducing noise interference to the elevator vibration data acquisition circuit; the three-axis acceleration sensor comprises a baseplate and a shell covered on the baseplate, a first circuit board is fixedly arranged in an x-axis direction of the baseplate, a second circuit board is fixedly arranged in a y-axis direction of the baseplate, and a third circuit board is fixedly arranged in a z-axis direction of the baseplate, the first circuit board, the second circuit board and the third circuit board form a structure of being perpendicular each other, the first circuit board, the second circuit board and the third circuit board are all provided with an acceleration sensor module and a conditioning circuit for adjusting the analog signal data accuracy of the sensor, the conditioning circuit is connected to the acceleration sensor module, the acceleration sensor module on the first circuit board, the acceleration sensor module on the second circuit board, and the acceleration sensor module on the third circuit board form an acceleration signal for measuring three directions of the x-axis, the y-axis, and the z-axis;

wherein the casing is provided with a drawer on the side, two grooves are provided on the drawer, a vibration identification device is provided in each groove, the vibration identification device comprises a tubbiness shell, a receiving groove is provided on the tubbiness shell, a rotary column is provided in the receiving groove, an elastic stretching fixing rope is symmetrically arranged on the rotary column, a hook for hooking an handrail belt of escalator is provided on an end of the elastic stretching fixing rope; a rotary handle is provided on the rotary column; the tubbiness shell is provided with a rechargeable battery and a circuit board powered by the rechargeable battery; the circuit board is provided with a MCU, the MCU is connected to a vibrating sensor and a bluetooth communication module; the circuit board is further provided with a charging and discharging circuit, a power supply end of the charging and discharging circuit is connected to positive and negative electrodes on the sidewall of the tubbiness shell; a switch button is provided on the tubbiness shell; and the tubbiness shell is provided with a limiting convex portion corresponding to a limiting concave portion on a sidewall of the groove; positive and negative electrode columns are provided in the grooves, the positive and negative electrode columns are respectively correspond to the positive and negative electrodes; a clamping part is arranged on a sidewall of the drawer for the drawing and clamping of the drawer.

2. The elevator operation quality tester of claim 1, wherein the power isolation module comprises a power module URB2412YMD-10WR3, a capacitor C87, a capacitor C88, an electrolytic capacitor CD17, a capacitor C86, a capacitor C85, and an electrolytic capacitor CD16, the capacitor C87, the capacitor C88 and the electrolytic capacitor CD17 are connected in parallel, one end of the electrolytic capacitor CD17 is connected to an internal power supply, the other end of the electrolytic capacitor CD17 is connected to the analog signal ground GND, one end of the capacitor C87 is connected to VOUT pin of the power module URB2412YMD-10WR3, the other end of the capacitor C87 is connected to VGND pin of the power module URB2412YMD-10WR3, the capacitor C86, the capacitor C85 and the electrolytic capacitor CD16 are connected in parallel, one end of the electrolytic capacitor CD16 is connected to an outer power supply, the other end of the electrolytic capacitor CD16 is connected to a digital signal ground DGND, one end of the capacitor C85 is connected to VIN pin of the power module URB2412YMD-10WR3, the other end of the capacitor C85 is connected to EARTH pin of the power module URB2412YMD-10WR3.

3. The elevator operation quality tester of claim 1, wherein the power circuit conversion module comprises a 12V power to 9V power circuit, a 9V power to 3.3V power circuit, a 9V power to 2.5V power circuit and a 9V power to 5V power circuit, the 12V power to 9V power circuit is connected to the power isolation module, one end of the 9V power to 3.3V power circuit, the 9V power to 2.5V power circuit and the 9V power to 5V power circuit are all connected to the 12V power to 9V power circuit, the other end of the 9V power to 3.3V power circuit, the 9V power to 2.5V power circuit and the 9V power to 5V power circuit are all connected to the analog-digital conversion module, and the three-axis acceleration sensor is connected to the 9V power to 3.3V power circuit.

4. The elevator operation quality tester of claim 3, wherein the 12V power to 9V power circuit comprises a LM317DCY chip, a capacitor C8, a chip inductor B2, an electrolytic capacitor CD3, a capacitor C9, a resistor R14, a capacitor C12, a resistor R11, a diode D3, a resistor R9, an electrolytic capacitor CD2, a capacitor C6, a capacitor C7, and a resistor R953; the electrolytic capacitor CD3 and the capacitor C9 are connected in parallel, thereafter, one end is connected to the capacitor C8 and the chip inductor B2 in series, the other end is connected to VIN pin of the LM317DCY chip; the capacitor C8 is connected to an internal power supply of the power isolation module, the resistor R14 and the capacitor C12 are connected in parallel, thereafter, one end is connected to ADJ pin of the LM317DCY chip, the other end is connected to analog signal ground GND; the resistor R11 and the diode D3 are connected in parallel, thereafter, one end is connected to OUT pin of the LM317DCY chip, the other end is connected to the capacitor C12; the electrolytic capacitor CD2, the capacitor C6, the capacitor C7 and the resistor R953 are connected in parallel, thereafter, one end is connected to one end of the resistor R9, the other end is connected to analog signal ground GND; the other end of the resistor R9 is connected to the diode D3;

the 9V power to 3.3V power circuit comprises an AZ1117H-3.3TRG1 chip, a capacitor C17, a capacitor C18, a capacitor C19, a capacitor C20 and a resistor R51, the capacitor C17 and the capacitor C18 are connected in parallel, thereafter, one end is connected to the capacitor C7 of the 12V power to 9V power circuit, the other end is connected to IN pin of the AZ1117H-3.3TRG1 chip, VOUT pin of the AZ1117H-3.3TRG1 chip is connected to OUT pin in parallel, the capacitor C19, the capacitor C20 and the resistor R51 are connected in parallel, thereafter, one end is connected to VOUT pin of the AZ1117H-3.3TRG1 chip, the other end is connected to the analog signal ground GND;

the 9V power to 2.5V power circuit comprises an AZ1117EHADJ chip, a capacitor C26, a capacitor C27, a resistor R19, a resistor R20, a capacitor C22, a capacitor C23 and a resistor R50, the capacitor C26 and the capacitor C27 are connected in parallel, thereafter, one end is connected to the capacitor C7 of the 12V power to 9V power circuit, the other end is connected to VIN pin of the AZ1117EHADJ chip; the resistor 19 and the resistor R20 are connected in series, thereafter, the resistor R20 is connected to ADJ pin of the AZ1117EHADJ chip, the resistor R19 is connected to the OUT pin of the AZ1117EHADJ chip; the capacitor C22, the capacitor C23 and the resistor R50 are connected in parallel, thereafter, one end is connected to OUT pin of the AZ1117EHADJ chip, the other end is connected to the analog signal ground GND;

the 9V power to 5V power circuit comprises an ADR4533ARZ chip, a capacitor C50, a chip inductor B9, an electrolytic capacitor CD13, a capacitor C51, a resistor R34, an electrolytic capacitor CD14, a capacitor C52 and a capacitor C53, the electrolytic capacitor CD13 and the capacitor C51 are connected in parallel, thereafter, one end is connected to the capacitor C50 and the chip inductor B9 in series, the other end is connected to VIN pin of the ADR4533ARZ chip; the electrolytic capacitor CD14, the capacitor C52 and the capacitor C53 are connected in parallel, thereafter, one end is connected to the resistor R34, the other end is connected to the analog signal ground GND, and the resistor R34 is connected to VOUT pin of the ADR4533ARZ chip.

5. The elevator operation quality tester of claim 4, wherein the acceleration sensor module comprises J39 socket and a sensor, the sensor is connected to the J39 socket, the sensor comprises an E6308 chip, a capacitor C3, a capacitor C4, a capacitor C10, a resistor R6 and a resistor R7, the capacitor C4 is connected in series with the capacitor C10 and is connected in parallel with the capacitor C3 thereafter, the capacitor C3 is connected to the capacitor C20 of the AZ1117H-3.3TRG1 chip, a fifth pin of the J39 socket is connected to ST pin of the E6308 chip, one end of the capacitor C4 is connected to VDD pin of the E6308 chip, and the other end is connected to VMID pin of the E6308 chip; the resistor R6 is connected to OUTN pin of the E6308 chip, and the resistor R7 is connected to OUTP pin of the E6308 chip; the conditioning circuit for adjusting the analog signal data accuracy of the sensor comprises an ADA4528-2TCPZ chip and a capacitor C11, one end of the capacitor C11 is connected to V+ pin of the ADA4528-2TCPZ chip, the other end is connected to the capacitor C53 of the 9V power to 5V power circuit, OUTA pin and −INA pin of the ADA4528-2TCPZ chip are connected in parallel, +INA pin of the ADA4528-2TCPZ chip is connected to OUTP pin of the E6308 chip through the resistor R7, and +INB pin of the ADA4528-2TCPZ chip is connected to OUTN pin of the E6308 chip through the resistor R6.

6. The elevator operation quality tester of claim 5, wherein the analog-digital conversion module comprises an AD7766 chip, a resistor R41, a resistor R45, a capacitor C71, a capacitor C80, a capacitor C57, a capacitor C72 and a capacitor C73, a first pin of the J39 socket is connected to the capacitor C7 of the 12V power to 9V power circuit, a second pin of the J39 socket is connected to VIN+ pin of the AD7766 chip through the resistor R41, a third pin of the J39 socket is connected to VIN− pin of the AD7766 chip through the resistor R45, and a fourth pin of the J39 socket is connected to the analog signal ground GND, and VRef+ pin of the AD7766 chip is connected to the capacitor C71 and the capacitor C53 of the 9V power to 5V power circuit respectively, the capacitor C80 and the capacitor C57 are connected in parallel, thereafter, one end is connected to AVdd pin of the AD7766 chip, the other end is connected to the analog signal ground GND; AVdd pin of the AD7766 chip is connected to the capacitor C23 of the 9V power to the 2.5V power circuit, DVdd pin of the AD7766 chip is connected to the capacitor C23 of the 9V power to the 2.5V power circuit and the capacitor C72 respectively, and Vdrive pin of the AD7766 chip is connected to the capacitor C20 of the 9V power to the 3.3V power circuit and the capacitor C73 respectively.

7. The elevator operation quality tester of claim 6, wherein the analog and digital signal isolation module comprises an ADUM3151A chip, an ACPL_M61 chip, a capacitor C89, a resistor R70, a resistor R71, a resistor R72, a resistor R73, a resistor R79, a capacitor C95, a resistor R48, a resistor R74, a resistor R77, a resistor R78, and a capacitor C96, VDD pin of the ACPL_M61 chip is connected to VDD1 pin of the ADUM3151A chip, the resistor R74 is connected to Anode pin of the ACPL_M61 chip, the resistor R77 is connected to Cathode pin of the ACPL_M61 chip, and the resistor R78 is connected to VO pin of the ACPL_M61 chip, VDD2 pin of the ADUM3151A chip is connected to Vdrive pin of the AD7766 chip, the capacitor C89 is connected to VDD2 pin of the ADUM3151A chip, the resistor R70 is connected to SCLK pin of the ADUM3151A chip, the resistor R71 is connected to SO pin of the ADUM3151A chip, the resistor R72 is connected to nSSS pin of the ADUM3151A chip, the resistor R73 is connected to VOA pin of the ADUM3151A chip, the resistor R79 is connected to VOB pin of the ADUM3151A chip, the capacitor C95 is connected to VDD1 pin of the ADUM3151A chip, and the resistor R48 is connected to VIB pin of the ADUM3151A chip.

8. The elevator operation quality tester of claim 1, wherein two first fixing plates are vertically arranged on a right side of the baseplate, and the two first fixing plates are arranged side by side, two second fixing plates are vertically arranged on a lower side of the baseplate, and the two second fixing plates are arranged side by side, the first circuit board is fixed on the two second fixing plates, the second circuit board is fixed on the two first fixing plates, the third circuit board is fixed on the surface of the baseplate, and the first circuit board, the second circuit board and the third circuit board are perpendicular to each other.

9. The elevator operation quality tester of claim 1, wherein a filtering processing is proceed on acceleration data acquired by the three-axis acceleration sensor to decrease interference from external interference signals, the filtering processing specifically comprises: the filtering process specifically comprising: performing a 50 hz notch filtering algorithm on the acquired acceleration initial data by using a sampling rate of 2000 hz:

$$y_{50}(k) = -A(1,2)*y_{50}(k-1) - A(1,3)*y_{50}(k-2) + B(1,1)*x(k) + B(1,2)*x(k-1) + B(1,3)*x(k-2),$$

wherein x(k) is initial value of the acceleration sampling at time k, and $y_{50}(k)$ is acceleration data after the 50 hz notch filtering;

$$B_{1\times 3} = \left[1, -2*\cos\left(\frac{\omega_0}{\omega_f}*2\pi\right), 1\right];$$

$$A_{1\times 3} = \left[1, -2*\alpha*\cos\left(\frac{\omega_0}{\omega_f}*2\pi\right), \alpha^2\right];$$

wherein A(i, j) refers to data on the ith row and jth column of matrix A; B(i, j) refers to data on the ith row and jth column of matrix B; $\omega_0$ refers to notch frequency of notch filter, which is taken 50 hz, $\omega_f$ refers to signal sampling frequency, α refers to notch filter coefficient, which is taken 0.9;

then, performing a 100 hz notch filtering algorithm on the acceleration data after the 50 hz notch filtering algorithm:

$$y_{100}(k)=-C(1,2)*y_{100}(k-1)-C(1,3)*y_{100}(k-2)+D(1,1)*y_{50}(k)+D(1,2)*y_{50}(k-1)+D(1,3)*y_{50}(k-2)$$

wherein $y_{100}(k)$ is acceleration data after the 100 hz notch filtering;

$$C_{1\times3} = \left[1 - 2*\cos\left(\frac{\omega_1}{\omega_f}*2\pi\right), 1\right];$$

$$D_{1\times3} = \left[1 - 2*\alpha*\cos\left(\frac{\omega_1}{\omega_f}*2\pi\right), \alpha^2\right];$$

wherein C(i,j) refers to data on the ith row and jth column of matrix C; D(i, j) refers to data on the ith row and jth column of matrix D; $\omega_1$ refers to notch frequency of notch filter, which is taken 100 hz, $\omega_f$ refers to signal sampling frequency, α refers to notch filter coefficient, which is taken 0.9;

finally, the acceleration data after the 100 hz notch filtering is passed through a second-order chebyshev low-pass filter with a cutoff frequency of 120 hz, three-axis acceleration data is obtained by three-axis acceleration data of the second-order chebyshev low-pass filter using one time integral, and elevator location information is obtained by three-axis acceleration data of the second-order chebyshev low-pass filter using double time integration.

* * * * *